United States Patent [19]

Selifanov et al.

[11] Patent Number: 5,643,343

[45] Date of Patent: Jul. 1, 1997

[54] ABRASIVE MATERIAL FOR PRECISION SURFACE TREATMENT AND A METHOD FOR THE MANUFACTURING THEREOF

[76] Inventors: Oleg Vladimirovich Selifanov, Apt. 52, Bldg. 6 Sosny, Minsk, Belarus, 220109; Eduard Ivanovich Tochitsky, Apt. 188, Bldg. 15 Kulman Str., Minsk, Belarus, 220100; Valerii Vladimirovich Akulich, Apt. 40, Block 2, Bldg. 66, Balkalskaia Str., Minsk, Belarus, 220102

[21] Appl. No.: 342,087

[22] Filed: Nov. 17, 1994

[30] Foreign Application Priority Data

Nov. 23, 1993 [BY] Belarus .................. 01013-01

[51] Int. Cl.$^6$ .................. B24D 11/00; C09C 1/68
[52] U.S. Cl. .................. 51/306; 51/295; 51/297
[58] Field of Search .................. 51/295, 297, 306; 427/248.1, 249; 428/402, 408

[56] References Cited

U.S. PATENT DOCUMENTS

| | | | |
|---|---|---|---|
| 3,992,178 | 11/1976 | Markoo et al. | 51/295 |
| 4,228,142 | 10/1980 | Holcombe, Jr. et al. | 427/249 |
| 4,822,466 | 4/1989 | Rabalais et al. | 204/192.15 |
| 4,902,535 | 2/1990 | Garg et al. | 427/249 |
| 4,938,940 | 7/1990 | Hirose et al. | 427/249 |
| 4,981,717 | 1/1991 | Thaler | 427/53.1 |
| 4,987,007 | 1/1991 | Wagal et al. | 427/526 |
| 5,009,966 | 4/1991 | Garg et al. | 428/627 |
| 5,061,292 | 10/1991 | Chen et al. | 51/295 |
| 5,071,708 | 12/1991 | Komaki et al. | 428/403 |
| 5,078,848 | 1/1992 | Anttila et al. | 204/192.38 |
| 5,112,643 | 5/1992 | Ikegaya et al. | 427/249 |
| 5,401,543 | 3/1995 | O'Neill et al. | 427/580 |
| 5,488,774 | 2/1996 | Janowski | 30/346.53 |
| 5,500,273 | 3/1996 | Holmes et al. | 51/295 |

FOREIGN PATENT DOCUMENTS

| | | |
|---|---|---|
| 2 054 050 | 5/1992 | Canada . |
| 0 254 560 | 1/1988 | European Pat. Off. . |
| 0 481 722 A1 | 4/1992 | European Pat. Off. . |
| 37 06 496 C1 | 3/1988 | Germany . |
| 60-210597 | 10/1985 | Japan . |
| 60-255366 | 12/1985 | Japan . |
| 63-262468 | 10/1988 | Japan . |
| 1 166 333 | 6/1989 | Japan . |
| 1 177 973 | 7/1989 | Japan . |
| 2-266926 | 10/1990 | Japan . |
| 3-3778 | 1/1991 | Japan . |
| 3 054 108 | 3/1991 | Japan . |
| 3 055 164 | 3/1991 | Japan . |
| 3-55163 | 3/1991 | Japan . |
| 3-158468 | 7/1991 | Japan . |
| 5 069 341 | 3/1993 | Japan . |
| 5 311 442 | 11/1993 | Japan . |
| 6-29401 | 4/1994 | Japan . |

OTHER PUBLICATIONS

C.B. Collins, et al., "Thin-Film Diamond" The Texas Journal of Science. vol. 41, No. 4, 1989. pp. 342–358.

J. Krishnaswamy, et al., "Thin-Film Deposition by a New Laser Ablation and Plasma Hybrid Technique" Appl. Phys. Lett., vol. 54, No. 24, Jun. 12, 1989. pp. 2455–2457.

H.-J. Scheibe, et al., "Film Deposition by Laser-Induced Vacuum Arc Evaporation" IEEE Transactions on Plasma Science, vol. 18, No. 6, Dec. 1990. pp. 917–922.

E.I. Tochitsky, et al., "Electrical Erosion Pulsed Plasma Accelerators for Prepring Diamond-Like Carbon Coatings" Surface and Coatings Technology, vol. 47, 1991. pp. 522–527.

E.I. Tochitsky, et al., "The Formation of Diamond-Like Carbon Coatings for Raising the Wear Resistance of Precision Friction Pairs" Surface and Coatings Technology, vol. 47, 1991. pp. 792–796.

*Primary Examiner*—Deborah Jones
*Attorney, Agent, or Firm*—David G. Beck; Townsend and Townsend and Crew LLP

[57] ABSTRACT

An abrasive material is proposed which is useful for the precision treatment of surfaces. This material may be in the form of an abrasive layer adhered by chemical and/or physical bonds to a carrier, the latter preferably made of a flexible material such as plastic. Alternatively, the abrasive material may be in the form of a free abrasive without a carrier. The abrasive material may be in the form of a vacuum condensate consisting of at least 80 atomic percent of an ultradispersed composite superhard diamond-like substance, preferably containing carbon, and including not more than 0.1 atomic percent hydrogen and oxygen, combined. The abrasive material is preferably obtained from the pulse-flows of an accelerated electroerosive plasma.

15 Claims, 2 Drawing Sheets

ABRASIVE MATERIAL FOR PRECISION SURFACE TREATMENT AND A METHOD FOR THE MANUFACTURING THEREOF

BACKGROUND OF THE INVENTION

The present invention relates to the field of precision surface treatment, in particular to abrasive materials used in such treatments, and to the method of manufacturing the abrasive materials.

A conventional abrasive material for precision surface treatment usually consists of a powder of free abrasive grains of micrometer-submicrometer size which are made of materials of high hardness. The abrasive grains are commonly embedded within a polishing paste or fixed within a layer applied to some other form of carrier.

Flexible abrasive materials are used to effectively polish objects having an irregular surface or shape. Such flexible abrasive materials may be in the form of abrasive belts which have strength and flexibility characteristics sufficient to provide tight contact between the surface of the abrasive belt and the irregular surface of the object being polished.

For precision surface treatment it is preferable to use diamonds as the abrasive grains since diamonds possess the highest hardness value of all known substances. Unfortunately natural diamond resources are extremely limited and artificial diamond crystals are very difficult to produce. The difficulties in obtaining artificial diamonds are primarily due to the high temperature and pressure processing requirements. In view of this fact, the search for new, highly efficient abrasive materials suitable for the precision treatment of surfaces, as well as for the processes which would permit such abrasive materials to be manufactured, is a continuous, ongoing effort.

Diamond-like carbon ("DLC") is an amorphous carbon material deposited as a coating using either plasma enhanced physical vapor deposition (PVD) techniques or chemical vapor deposition (CVD) techniques. These materials are called 'diamond-like' because their mechanical, optical, and electrical properties can be very close to the properties of natural diamond. Diamond-like has become a standard term of art. For example, see the *Proceedings of the First International Symposium on Diamond and Diamond-Like Films*, The Electrochemical Society, Vol. 89–12 (1989).

Many methods of coating diamond-like carbon films onto particulates, surfaces, and fibers are known. For example, gaseous-phase plasma spraying, electron-cyclotron/magnetic field assisted chemical vapor deposition ("CVD"), and other CVD processes. Common disadvantages to all CVD methods are that they are generally inefficient, they must be carried out under reduced pressure with the application of microwave energy, and the surface to be coated must be able to withstand temperatures of at least 200° to 400° C. More importantly, the films produced by CVD methods yield diamond-like microstructures having a significant number of C–H bonds. For this reason, materials formed by these methods are often termed "hydrogenated diamond-like carbon" or "HDLC." Articles made by incorporating abrasive particles coated with HDLC are insufficiently flexible for most purposes unless high cost thread-like fibers coated with HDLC are employed. Less expensive and more flexible articles may be made using variations of CVD, but still result in the formation of undersized HDLC.

Thin films of HDLC are undesirable because they are dielectric or semiconductors, and thus accumulate static electricity. This property is deleterious to any abrading action since dust and other particulates accumulate and adhere to the surfaces of the abrasive material. The presence of hydrogen in HDLC thin films also limits the hardness of the films.

Physical vapor deposition ("PVD") processes for depositing diamond-like carbon ("DLC") films are known. Japanese Kokai Patent No. H2-266926 describes an abrasive tape formed from a PVD layer deposited on a plastic substrate. A disadvantage of the process is that it cannot produce an abrasive layer with a microhardness exceeding that obtained for HDLC.

Ion beam, super high vacuum processes are known which deposit carbon ions from an ion beam. Although such techniques produce carbide-type films of high hardness, they require super high vacuum, have low efficiency, and are technically complex.

A more simple method for obtaining vacuum condensates of various materials, including DLC, is known in the art. This method consists of creating a plasma of highly ionized carbon and periodically depositing portions of the plasma onto the surface of a substrate. These portions are obtained by the pulse-laser evaporation of graphite in a vacuum, under a pressure for the residual gases of about $10^{-6}$ Torr, with the subsequent intensification of plasma formation by means of a vacuum electrical-arc discharge. (cf. H. J. Scheibe and P. Siemroth, "Film Deposition by Laser-Induced Vacuum Arc Evaporation," in *IEEE Transactions on Plasma Science*, Vol. 18, No. 6, December 1990, 917–922).

Due to the short-term nature of the deposition process with the pulse-type methods described above, it becomes possible to obtain vacuum condensates on substrates having a low thermal destruction temperature, e.g. on plastic substrates. However, these condensates generally demonstrate undesirable dielectric properties. (cf. J. Krishnaswani, et al., "Laser and Plasma Enhanced Deposition of Diamond and Diamond-Like Films by Physical and Chemical Vapor Deposition Technique," in SPIE, vol. 1190, *Laser-Optical Processing of Electronic Materials*, 1989, p. 109–117).

Other disadvantages associated with the above described pulse method are the high costs of lasers, the instability of the excitation of the vacuum-arc discharge with the pulse-laser evaporation of graphite, and the rapid dusting-over of the window used for the introduction of laser radiation into the vacuum chamber. The last effect is especially noticeable when the process is being carried out at a high rate.

The cathodic arc process, also known as vacuum arc or electromagnetic erosive plasma accelerator, is known to produce DLC coatings that are harder than either sputtering or laser ablation processes. This discharge occurs in a vacuum environment when a sufficient current, greater than about 50 amps, is passed between electrodes. Once the discharge is started the current from the cathode passes through a small spot called the arc spot, estimated to be about 10 microns, on the cathode surface. The extraordinary current densities of over a million amps per square centimeter causes a flow of ions and macroparticles to be ejected form the arc spot. The fraction of ions that are produced can be quite high and is higher for higher melting point cathodes, for example carbon discharge have ion fractions of over 90–95%.

The vacuum or cathodic arc discharge can be powered either by a DC power supply, frequently operating in a current controlled mode, or from a charged capacitor bank. The latter is often referred to as pulsed cathodic (or vacuum) arc discharges or as an electromagnetic erosive plasma accelerator.

There are several methods to initiate the arc discharge; a mechanical 'striker' may be used to strike the arc, similar to a welder, or several different types of secondary discharges (e.g., a spark, puff of gas plasma, or thin film ablation) may be directed into the interelectrode region.

The high ion fraction of carbon cathodic arc discharges makes this process an ideal method to produce superhard and non-hydrogenated DLC coatings.

U.S. Pat. No. 5,075,848 describes a method for the deposition of coatings from plasma flows by means of a periodically generated pulse electromagnetic erosive plasma accelerator, operating on the basis of a high-current vacuum electrical arc. This method consists of positioning the substrate within the deposition chamber, evacuating the chamber, and then injecting portions (doses) of the initiating plasma into the electrode gap of the accelerator. Each of the plasma portions in question is obtained by passing a firing-current pulse between an consumable electrode and a firing electrode. The firing electrode is located within the consumable electrode, and installed in such a manner that a gap forms between the two of them. In operation, the gap must first be electrically broken then high-current vacuum electric arc discharges are excited in the electroerosive plasma being emitted from the plasma-forming surface of the consumable electrode. This process results in the generation of pulse flows of the accelerated electroerosive plasma of the substance being precipitated by means of the accelerator. The plasma flows are directed towards the surface of the substrate, forming a vacuum condensate on the surface of the substrate by the deposition of the generated flows of plasma.

Such a method makes it possible to obtain a thin film vacuum condensate of various materials, including DLC, with good adhesion even if the substrate surface is maintained at a low temperature during condensation. However, the separation of the pulse flows, which in this process is carried out with the use of a curvilinear solenoid connected in series with the electrode gap of the plasma accelerator, appears to be insufficiently effective. Furthermore, an extremely high pulse pressure (not less than 5 to 10 kV) must be applied to the vacuum gap between the eroding and firing electrodes in order to obtain each portion of the initiating plasma. During this process the flows of the generated electroerosive plasma receive a considerable number of particles having an extremely high energy. This is highly undesirable for many vacuum condensates, especially thin DLC films. Finally, it should be noted that the periodic high-voltage breakdown of the above-described vacuum gap constitutes a rather complicated technical problem. Such a process is characterized by low reliability and low stability.

For all of the reasons previously discussed the mass production of high-quality vacuum condensates, in particular carbon, is very desirable. It is especially desirable to have a high level of reproducibility of condensate composition and microstructure as well as other properties. Although the above identified methods make it possible to apply, in a vacuum, coatings of various materials including DLC, they are still not suitable for manufacturing carbon-based abrasive materials.

It is an object of the present invention to provide a superhard abrasive material, preferably carbon-based, characterized by high polishing ability, applicable to the treatment of objects made of various materials, and being generally suitable for a variety of applications. It is another object of the invention to make it possible to produce the abovementioned abrasive material both in the form of free abrasive and as a bound abrasive attached to a flexible or rigid carrier. Still another object of the invention is to provide a carbon-based superhard abrasive material with a low surface electric resistivity. Another object is to provide an improved, highly reliable and efficient method of forming a carbon-based vacuum condensate abrasive material using pulse-type electromagnetic erosive plasma accelerators. It is an object of the invention to provide this method in a way which ensures the reproducibility of the material's characteristics, and which would allow the use of low thermal destruction temperature carriers.

Another object of the invention is to provide a method which allows the industrial-scale production of abrasive materials comprising superhard vacuum condensates, preferably carbon-based, with characteristics superior to those obtained by conventional methods of continuous vacuum vapor deposition, and with a corresponding superior quality.

SUMMARY OF THE INVENTION

An abrasive material is proposed which is useful for the precision treatment of surfaces. This material may be in the form of an abrasive layer adhered by chemical and/or physical bonds to a carrier, the latter preferably made of a flexible material such as plastic. Alternatively, the abrasive material may be in the form of a free abrasive without a carrier. The abrasive material may be in the form of a carbon-based superhard vacuum condensate consisting of at least 80 atomic percent of an ultradispersed (superdispersed) composite superhard diamond-like substance, preferably containing carbon, and including not more than 0.1 atomic percent of hydrogen and oxygen. The abrasive material is preferably obtained from the pulse-flows of an accelerated electroerosive plasma.

In the inventive abrasive material, the above-mentioned diamond-like substance may contain metal, preferably a rare earth metal and/or a high-melting point material. In some embodiments the amount of metal in the diamond-like substance may be up to 20 atomic percent. In embodiments where the abrasive material is bonded to a carrier, the vacuum condensate preferably has a predetermined surface pattern or texture. In embodiments where the abrasive material is used without a carrier, such as a free powder-like abrasive material, the vacuum condensate typically comprises plate-like particles of substantially equal thickness having transverse dimensions substantially equal to the thickness of the condensate, and with longitudinal dimensions about 3 to 7, preferably about 5 times greater than the transverse dimensions. The transverse dimensions may vary from about 2 to about 1000 times the thickness of the condensate and the longitudinal dimensions may vary from about 2 to about 100,000 times the thickness of the condensate.

The invention also provides a method for the manufacture of the abrasive material. One embodiment of this method comprises the following steps: placing a substrate within a deposition chamber; evacuating the deposition chamber; initiating a carbon cathodic arc plasma discharge between a set of primary electrodes of a pulsed cathodic arc plasma accelerator to form a carbon plasma, one of said primary electrodes being a consumable carbon electrode; depositing a diamond-like carbon coating by directing said carbon plasma towards the surface of the substrate; and terminating said process after a desired thickness has been achieved.

In preferred embodiments, the material of the consumable electrodes is subjected to degassing and the surface of the electrode is purified by application of additional vacuum electric arc discharges during the time period in which the deposition chamber is being stabilized to a predetermined pressure. During this process the generated electroerosive plasma is prevented from interacting with the carrier.

The vacuum condensate may be formed with the accompanying deposition of another substance, preferably a metal, specifically a rare earth and/or high melting point metal. As used herein, a high melting point means greater than 1000° C. If necessary, the plasma flows of different substances are generated by individual self-contained plasma accelerators.

In a preferred embodiment, the surface of condensation is bombarded with a flow of ions or plasma, preferably such treatment be carried out in a pulse mode during intervals between the generation of pulse flows of the electroerosive plasma. This treatment improves the adhesion of the vacuum condensate by modifying the surface condition. In the event that the inventive vacuum condensate abrasive material is to be formed on a carrier, the vacuum condensate is preferably deposited on a surface having a predetermined surface texture. In the event that the inventive vacuum condensate abrasive material is to be formed in particulate form, the vacuum condensate is separated from the carrier. In this case the carrier is preferably coated with an anti-adhesive sublayer.

DESCRIPTION OF THE PREFERRED EMBODIMENTS

Figure 1:
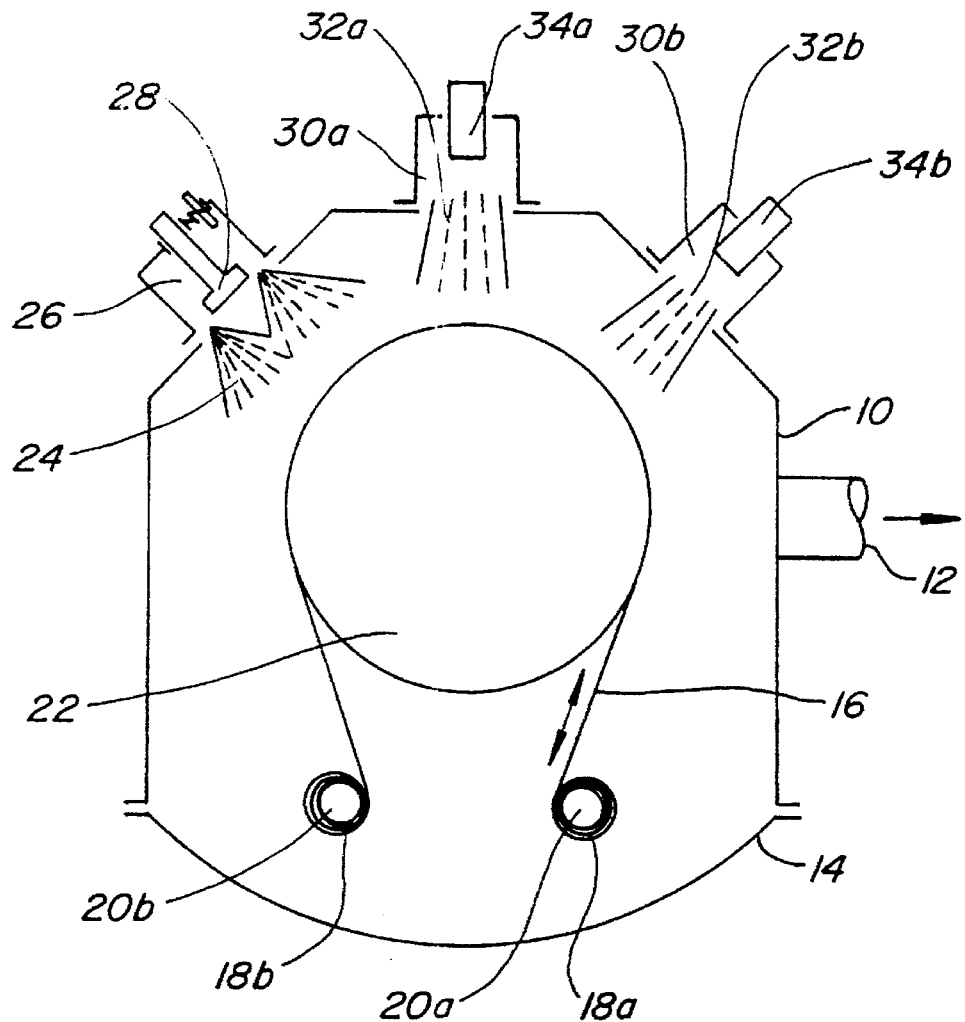
FIG. 1 is a schematic diagram of an apparatus of the invention to apply a vacuum condensate from a plasma onto a flexible carrier.

The inventive vacuum condensate abrasive material, preferably a diamond-like carbon based vacuum condensate, is obtained from the pulse flows of an accelerated electroerosive plasma. As used herein, "diamond-like carbon based" refers to a material containing 80 atomic percent or more of a diamond-like carbon substance. This vacuum condensate functions as an excellent polishing material suitable for the precision treatment of surfaces. As used herein, "polishing" refers to the removal of surface irregularities. The desired characteristics of the inventive vacuum condensate are a result of depositing the pulse flows of the accelerated electroerosive plasma, preferably of carbon, in a vacuum, thereby forming an ultradispersed superhard diamond-like substance consisting essentially of carbon and having a density within the range of about 2.7 to 3.5 g/cm$^3$. The inventive vacuum condensate comprises a composite of superfine crystallites (having dimension ranging from about 0.5 to 25 nm) dispersed in a quasi-amorphous phase, with the further attribute that there are no distinctive boundaries between the crystalline and quasi-amorphous phases.

As used herein, the term "superhard" refers to materials that have hardnesses greater than 5,000 kg/mm$^2$ when measured using a hardness tester capable of sub-micron indentation testing. Such testers include the Miniload 2 (made in Germany), the PMT-3 (made in Russia), and the Nanoindenter (made in USA). The measurements cited herein were made using either the Miniload 2 or the PMT-3. To minimize the degree that the substrate will affect the measurment, the applied load is kept low so that the indenter penetration does not exceed ⅓ of the coating thickness.

The hardness data supplied in this patent was obtained with the following procedure. A coating was deposited onto a hard WC substrate that was placed close to a polymer substrate in such a manner that each surface was exposed to equivalent deposition conditions. A load between 100 to 200 g was then applied using a pyramidal diamond indenter. The size of the indent was determined by viewing under an optical microscope. The hardness was then calculated using the equation H=F/A, where F=force and A=area.

In the event that the formation of the carbon-based vacuum condensate of the invention results from the pulse flows of accelerated electroerosive plasma of high-purity graphite, the obtained ultradispersed composite superhard diamond-like substance comprises a diamond-like carbon which is practically free of hydrogen and oxygen. Due to the lack of hydrogen, this substance does not suffer from the many disadvantages of conglomerate diamond-like material such as hydrogenized diamond-like carbon (i.e., HDLC). The latter material contains considerable quantities of hydrogen, generally in the range of 10 to 60 atomic percent.

The ultradispersed composite superhard diamond-like substance which is obtained during the formation of the carbon-based vacuum condensate from the pulse flows of the accelerated electroerosive plasma may have a wide range of microhardnesses and specific electrical resistivity, depending on the operating conditions and the final composition. These properties are conditioned by the variation in the quantitative ratio of carbon atoms having an sp$^3$, sp$^2$, and sp status of electrons on the electron valence shells. The prevalence of atoms with sp$^3$ bonds (which are typical of diamonds) and sp bonds (which are typical of carbyne) creates the basis for achieving high values of microhardnesses in the inventive high purity ultradispersed composite superhard diamond-like carbon. Specifically, in the event that the material contains a significant amount of sp$^3$ bonds, it becomes possible to create a thin-film structure with an extremely high microhardness and a sufficiently low specific surface electrical resistivity.

The values of the microhardness and electrical surface resistivity which are preferred for high quality abrasive materials are obtained when no more than 20% of the atoms form sp$^2$ bonds, and no more than 40% form sp bonds. Preferably, for ultradispersed composite superhard diamond-like carbon substances, the number of atoms having sp$^2$ bonds should be kept to an absolute minimum. The amount of sp$^2$ bonds can be controlled utilizing an additional ion or plasma treatment. It is preferable that such additional treatment be carried out in a pulse mode, preferably during the intervals between the generation of pulse flows of the accelerated erosive plasma of the substance being deposited.

Plasmon energy is the energy that is required to excite a collective motion of electrons in a solid. The amount of energy that is required is proportional to the solid's non-localized electron density which is proportional to the atom density. It has been proposed that the plasmon energy is proportional to the sp$^3$/sp$^2$ bond ratio. Furthermore experimental evidence has shown that diamond-like physical properties are correlated with high plasmon energies. That is, as the plasmon energy increases beyond the value for graphite, 25 eV, and approaches the value for diamond, 33 eV, the physical properties of the material in question become more diamond-like.

Plasmon energies for non-hydrogenated DLC vary from 26 eV to 32 eV depending upon the sp$^3$/sp$^2$ bond ratio. Plasmon energies for hydrogenated DLC vary from 21 eV to about 24 eV, depending upon the hydrogen concentration.

Electron techniques such as transmission electron microscopy (TEM), ESCA, ultra-violet photoemission, and electron reflection can be used to measure the plasmon energy. The method of determining the plasmon energy from these techniques is very similar. Two peaks in the electron energy distribution are identified as the primary and secondary peaks. The secondary peak represents those electrons that have lost energy from the primary electrons and have created a plasmon. The plasmon energy is determined by measuring the energy difference between these two peaks.

Vacuum condensates of the invention consist essentially of carbon and, depending on the conditions of the deposition, they have microhardnesses of no less than 7000 kg/mm$^2$ on a Vickers scale and surface resistivity in the range of about $10^5$, $10^6$, $10^7$, $10^8$, and $10^9$ Ohms. The above values of microhardnesses greatly exceed the maximum values of microhardness for HDLC (generally the maximum values are in the range of 4500 to 5500 kg/mm$^2$). (cf. Japanese Kokai Patent No. H2-266926). The introduction of small quantities (up to 9 atomic percent) of metals, preferably rare earth metals (such as holmium, erbium, ytterbium, yttrium, dysprosium, gadolinium) and/or high-melting point metals (such as chromium, molybdenum, tungsten, hafnium, titanium, zirconium), as well as nickel, into the structure of the carbon-based ultradispersed composite superhard diamond-like substance during the formation of the vacuum condensate does not exert a noticeable influence on the microhardness of this substance, while at the same time contributing to a further decrease of the values of the surface electrical resistivity.

When metal is introduced into the process used to form the vacuum condensate, the metal in the resultant material may form either metal-metal or metal-carbon chemical bonds. In the solid state, metals share their electrons forming metal-metal bonds, atoms in diamond form carbon-carbon covalent bonds, and in carbides the metal and carbon atoms share electrons and form hybrid metal-carbon bonds. The sharing of electrons modifies the binding energy of the other electrons which may be determined using the well-known technique of Electron Spectroscopy for Chemical Analysis (ESCA).

Furthermore, the presence of one or more of the abovementioned metals during the formation of the inventive vacuum condensate intensifies the nucleation and growth of a thin-film layer of a substance having a microstructure to that of diamond, and reduces the level of stress in this substance thereby increasing the adhesion of the condensate to the carrier.

When the content of the metal exceeds 10 atomic percent, the formation of an ultradispersed composite superhard substance with an sp$^3$ superstructure is less favorable and is sharply reduced. Preferably atoms of the inventive ultradispersed composite superhard diamond-like substance constitute not less than 80% of the total number of atoms included in the composition of the carbon-based vacuum condensate. It is preferable that the remaining atoms should form substances and/or structures of high hardness, preferably with lower values of surface electrical resistivity. This may be, for example, a quasi-amorphous carbonaceous matrix structure in which the abovementioned diamond-like substance is dispersed. A vacuum condensate composite of this nature can easily reach values of surface electrical resistivity within the range of $10^6$ to $10^2$ Ohms, with microhardnesses not less than 6500 kg/mm$^2$. In the event that the inventive carbon-based vacuum condensate contains less than 80 atomic percent of the ultradispersed composite diamond-like substance, the microhardness of the condensate drops sharply.

In another embodiment, the inventive vacuum condensate may contain the abovementioned metals in an amount of up to 20 atomic percent. One part of the metal may be included into the composition of the ultradispersed composite superhard diamond-like substance, and another part into the composition of the matrix structure. In this case it is preferable to form the vacuum condensate such that a predetermined amount of the metal remains free, i.e. having no chemical bonds with the other elements in the condensate composition. In this embodiment it is possible to obtain carbon-based vacuum condensates with a Vickers microhardness of more than 5000 kg/mm$^2$ and with lower values of surface electrical resistivity. Preferably the vacuum condensate comprises a thin-film, heterogeneous and laminated system. Vacuum condensates of this type may be deposited directly on the surface of the carrier or through an intermediate layer. If the condensate is deposited through an intermediate layer, it is preferable to use the rare earth metals named above to form the intermediate layer. The introduction of a metal in an amount exceeding 20 atomic percent into the inventive carbon-based vacuum condensate reduces the favorability to maintain the microhardnesses at the high levels indicated above.

If a carrier is used with the inventive vacuum condensate, preferably the surface texture of the carrier is characterized by a random distribution of surface irregularities ranging in height from about 0.02 to 2.0 micrometers. A coated carrier of this form possesses excellent abrasive capacity and makes it possible to perform high-quality polishing. Although a variety of materials can be used to form the carrier, preferably the carrier is made of a plastic film, for example polyethylene, polyamide, polycarbonate, polyacrylate, or polyethylene terephthalate. It is understood that not only plastic films can be used as carriers, but also hard and flexible substrates made of other materials. The term flexible simply refers to supple or pliant substrates. In this process, various types of substrate holders and respective mechanisms of their movement can be used. Finally, the inventive abrasive material may be formed and used without a carrier and typically comprises a vacuum condensate of high hardness, in the form of plate-type particles of substantially equal thickness with transverse dimensions substantially equal to the thickness of the condensate, and with longitudinal dimensions about five times exceeding those of the transverse dimension, given a condensate thickness which may easily vary from about 0.02 to 4.0 micrometers. In some instances the transverse dimensions may vary from about 2 to about 1000 times the thickness of the condensate and the longitudinal dimensions may vary from about 2 to about 100,000 times the thickness of the condensate. This free abrasive material may comprise a highly efficient powdered abrasive material which does not require special separation of particles by dimensions, and which may be used independently for dry polishing, as well as in combination with various polishing pastes and suspensions for wet polishing. The powdered abrasive material may also be dispersed within a binder and adhered to a substrate. The substrate may be a polymer, a cloth, or a paper.

The method of manufacturing the inventive abrasive material is preferably performed in a deposition chamber which has undergone a preliminary evacuation to a residual pressure of $5 \times 10^{-5}$ to $5 \times 10^{-7}$ Torr. If the pressure of the residual gases exceeds $5 \times 10^{-5}$ Torr it is difficult to achieve the desired purity of the vacuum condensate with respect to hydrogen and oxygen, thus making it difficult to achieve the desired abrasive characteristics of the condensate. If the deposition chamber is evacuated to a residual pressure below $10^{-7}$ Torr, it will not produce a significant improvement in the abrasive characteristics of the condensate.

To obtain a high-density initiating plasma of any material necessary for the invention, a firing-current pulse is passed through a localized contact of at least one consumable electrode. The contact comprises a thin-film conductor applied to the surface of an isolator and which is in contact with the firing electrode. This process provides a sufficiently high efficiency of excitation in the accelerator of the vacuum electric arc discharges with minimal energy consumption, on the order of several joules.

In an embodiment using two or more accelerators it is possible to provide a contact-free excitation of vacuum electric arc discharges on the main eroding electrode. This is especially important when the electrode in question is graphite. In this case there are two consumable electrodes, a basic and an auxiliary electrode. By varying the position of the localized contact on the consumable electrode, for example by rolling the isolator prior to the passage of an oncoming pulse firing current, it is possible to obtain a dependable, rhythmic ejection of the initiating plasma, along with a high uniformity of its distribution, over the volume of the electrode gap of the accelerator. This leads to an increase in the reliability of excitation of the electrical arc discharges as well as to more uniform consumption of the eroding electrodes.

In the preferred embodiment the voltage amplitude $V_f$ of the firing current pulses does not exceed 750 V and the voltage amplitude $V_a$ of the electrodes of the accelerator is maintained within the range of 100 to 500 V. These conditions encourage the excitation of vacuum electric arc discharges to occur with a probability of more than 0.95, thereby obtaining an optimal level of nucleation and growth of the inventive ultradispersed composite superhard diamond-like substances as well as of the vacuum condensate as a whole. If the probability of the excitation of the electrical arc discharges is below 0.95, the reproducibility of the process drops sharply. If the amplitude value of the firing current pulse voltage, $V_f$, exceeds 750 V, the flows of electroerosive plasma begin to receive particles with undesirably high levels of energy. If the amplitude value of the voltage on the electrodes of the accelerator, $V_a$, is below 100 V the reliability of the excitation of the discharge is affected, leading to an impairment of the adhesion of the inventive condensate to the carrier. When $V_a$ is greater than 500 V there is a tendency towards the graphitization of the diamond-like substance. The best conditions for the excitation of the vacuum arc dischargers is with a $V_a$ within the voltage range of 200 to 400 V. In fact, at $V_a$=200 V, the probability of the excitation of discharges in the plasma accelerator with a graphite cathode is equal to 0.996; with a molybdenum cathode, it is 0.990; with a titanium cathode, it is 0.994; with cathodes of chromium and yttrium, it approaches 0.999.

It is preferred that the amplitude of the firing-current pulses should be at least two times greater than the current which is required for the formation of one microspot of a vacuum arc discharge on the plasma-forming substance of the consumable electrode. It is preferred that its minimum value be between 300 and 900 A, the higher values corresponding to plasma-forming substances with high melting points. The amplitude of the current of vacuum electrical arc discharges preferably exceeds the amplitude of the firing current pulses, but should not exceed 10 kA. Typically, pulse vacuum electrical arc discharge is characterized by the presence of a plurality of microspots, although this is not required or necessarily preferred.

Individual microspots are mutually repelled from each other due to the generation of magnetic fields induced by the current of the electrical discharge. Thus individual microspots are constantly maintained at approximately equal distances from each other. Accordingly, while covering a considerable area of the plasma-forming surface of the eroding electrode these microspots move over this surface at an extremely high speed. Therefore during the pulsed discharge, which has a time interval of up to $10^{-3}$ seconds, these microspots have sufficient time to cover a distance comparable to the transverse dimensions of the plasma-forming surface of the eroding electrode. This constitutes an additional factor contributing to the improvement of the uniformity of the erosion of the plasma-forming surface. This factor also helps to substantially eliminate the overheating in the surface layer of the eroding electrode, thereby suppressing the emission of microparticles caused by such overheating.

If the duration of the electrical discharge exceeds $10^{-3}$ seconds, the plasma-forming surface of the eroding electrode may begin to overheat, resulting in an increase in the emission of microparticles. This may also lead to the appearance of undesired extremely high temperature excursions on the condensation surface, thereby negatively affecting the quality of the vacuum condensate. It is preferred, therefore, to maintain the electrical arc discharge within a time interval not exceeding $5 \times 10^{-4}$ seconds.

The minimum possible duration of each electrical arc discharge depends on the substance of the eroding electrode and the total impedance of the discharge circuit, as well as on the type of plasma accelerator used during plasma generation. Preferably the duration ranges from 20 to 50 microseconds, the lower values corresponding to metal consumable electrodes.

Allowing the pulsed vacuum electrical arc discharge current to exceed 10 kA generally leads to an increase in microparticle emission due to the effects of the increased electromagnetic forces on the separation of the microparticles from the plasma-forming surface in the area of the microspots. It is, however, possible to control the injection of the initiating plasma through the introduction of an external magnetic field. This is a result of the effect of the external magnetic field on the plasma-forming surface of the eroding electrode at the time of the displacement of the abovementioned magnetic field synchronously with the change in the position of the microspots. Preferably the induction field of the external magnetic field is parallel to the given surface and has its maximum in the area of localized contact. This same external magnetic field can also be used to control the erosion of the plasma-forming surface of the eroding electrodes since this erosion results from the directional movement of the initiating plasma and the electroerosive plasma which is obtained with each discharge in the area of a weaker magnetic field. Thus, it becomes possible to determine the direction of movement of the microspots of the electrical arc discharges and supplementally to increase the speed of their movement over the plasma-forming surface of the eroding electrodes. This action results from the phenomenon of diamagnetism of the plasma as well as by the fact that the current is shifted on a given surface due to interaction with the magnetic field, the lines of force of which are parallel to this surface. (Note that the current flows in a direction perpendicular to the external magnetic field through the initiating plasma in the area of localized contact, and then through the electroerosion plasma created by electrical arc discharge itself on the plasma-forming surface in the area of the microspot.) The combination of these factors help ensure extremely uniform erosion of the plasma-forming surface of the consumable electrodes as well as make it possible to obtain high reproducibility of the abrasive characteristics of the inventive vacuum condensate.

Achieving uniform erosion of the plasma-forming surface of the consumable electrodes is especially important when the consumable electrodes are made of porous granulated substances, in particular graphite. In turn, the suppression of the emission of microparticles which takes place in the process makes it possible to obtain high quality vacuum condensates by directly depositing generated flows of electroerosive plasma.

The generation of pulsed flows of accelerated electroerosive plasma of a single deposited substance (e.g., graphite), or of several substances (e.g., graphite and a metal), with the use of one or more plasma accelerators makes it possible to vary the composition of vacuum condensates. Thus it is possible to form vacuum condensates with a specific abrasive profile, for example varying microhardness and electrical resistivity.

In a preferred embodiment of the invention more than one accelerator is used, preferably each accelerator containing a consumable electrode made of a different material. This allows the composition, microstructure, and other properties of the vacuum condensate to be more easily controlled. It is preferable that at least one of the accelerators should allow the generation of high purity flows of electroerosive plasma of a metal. An accelerator of this type often fulfills some auxiliary function, for example the deposition of a sublayer.

In order to obtain the inventive vacuum condensate having the contents of hydrogen and oxygen in an amount less than 0.1 atomic percent each it is preferable that the frequency of incidence of the generated pulse flows of the accelerated electroerosive plasma be greater than 1 Hz, with the ratio of density of each deposited layer of plasma ($N_p$) to the density of flow of particles in the residual gases ($N_g$) be greater than 100 to 1. If $N_p/N_g$ is less than 100, the growing layer of the vacuum condensate will entrap hydrogen and oxygen in an increased quantity from the atmosphere of the residual gases. The higher the value of the $N_p/N_g$ ratio the better. However, the maximum possible value of this ratio is always limited by the maximum allowable integral flow of heat for the carrier, this heat flow being brought to the surface of condensation by the plasma.

When the frequency of incidence of the generated plasma flows is below 1 Hz an excessive amount of residual gases (up to one monolayer) has sufficient time to be adsorbed on the surface of condensation. This may occur even at a pressure of $5 \times 10^{-7}$ Torr. These excess residual gases cannot then be eliminated by the preplasmoid which is always available on the front of each generated plasma flow and which has an amount of energy of plasma particles and a quantity of such particles which are sufficient only for low-intensity etching (cleaning) of the surface of condensation.

The quality of the inventive vacuum condensate can be improved if the material of the consumable electrodes is subjected to degassing and the surface of the electrode is purified by application of additional vacuum electric arc discharges during the time period in which the deposition chamber is being stabilized to a predetermined pressure. Such an operation usually takes no more than one or two minutes. During the abovementioned time interval, access of the electrogenerated electroerosive plasma to the surface of the carrier is prevented, for example with the use of a mobile gate.

The deposition of a second material, preferably either a rare earth metal with a high melting point or nickel, during the formation of the inventive vacuum condensate intensifies the formation nucleation. This leads to vacuum condensates in a less-stressed state with better adhesion and with extremely low values of surface electrical resistivity. The generation and deposition of independent flows of plasma of different substances by the self-contained plasma accelerator also ensures a high-degree of dosing accuracy for each substance and permits strictly specified compositions of the inventive vacuum condensate to be obtained. The formation of a predetermined texture on the surface of the vacuum condensate is recommended for those cases when it is necessary to prepare an abrasive material of an increased abrasive capacity. The desired texture may be produced, for example, by growing "island-like" metal films of metals or alloys which are obtained by depositing the flows of electroerosive plasma of appropriate substances.

In another embodiment, the inventive vacuum condensate is separated from the carrier. Preferably this is accomplished by producing a dissolvable carrier, for example forming the carrier from pressed salt, and simply dissolving the carrier in water when desired. Under specific formation conditions the resultant vacuum condensates can be mechanically separated from the carrier by vibration, thereby forming a powder-like abrasive material. The latter method is especially effective when the vacuum condensate is formed on a carrier with an anti-adhesive sublayer. Such a sublayer may be formed from thin films of different organic substances, for example Langmuir films.

The present invention is further described with reference to the accompanying drawings and specific embodiments.

FIG. 1 is a schematic view of an apparatus useful for the manufacture of a vacuum condensate according to the present invention. A deposition chamber 10 can be evacuated through an evacuation opening 12 and is provided with a door 14 for the execution of various auxiliary operations, such as loading and unloading. Chamber 10 contains a carrier 16, in the form of a roll 18a–18b. Roll 18a–18b can be rewound in one or another direction with the use of a roller 20a or a roller 20b over a cooling drum 22. Carrier 16 preferably has a thickness within the range of from about 10 to 100 micrometers and a width of less than about 220 millimeters. Preferably the carrier may be made of a plastic material as previously described. The speed of rewinding may vary between about 0.6 and 6 centimeters per second.

Deposition chamber 10 is provided with at least one ion source 26 which has a cold cathode 28. The embodiment shown in FIG. 1 has two pulse electromagnetic erosion plasma accelerators, 30a and 30b, which operate on the basis of a high-current vacuum electrical arc. Ion source 26 generates an ion flow 24 and is intended for ion treatment of the surface of carrier 16, predominantly for ion cleaning. Preferably the ion flow 24 is of an inert gas, for example argon.

Each plasma accelerator 30a and 30b is intended to generate pulse glows 32a and 32b which are directed towards the surface of carrier 16 and comprise flows of an accelerated electroerosive plasma of at least 1 of the substances which are to be deposited onto the surface of carrier 16 in order to form a thin layer of a vacuum condensate thereon. The electroerosive plasma is obtained as a result of the erosion of the plasma surface of the consumable electrodes, 34a and 34b, of accelerators 30a and 30b. The chamber openings for the introduction of ion flow 24 and plasma flows 32a and 32b into the deposition chamber 10 may be blocked with the use of moveable gates (not shown).

In the preferred embodiment one plasma accelerator is used to generate pulse flows of the accelerated electroerosive plasma of carbon (graphite), or of an electroerosive plasma containing carbon and a metal (preferably a rare-earth metal and/or a high-melting point metal) while the other plasma accelerator is designed to generate pulse flows of the accelerated electroerosive plasma of the metal alone.

Figure 2A:
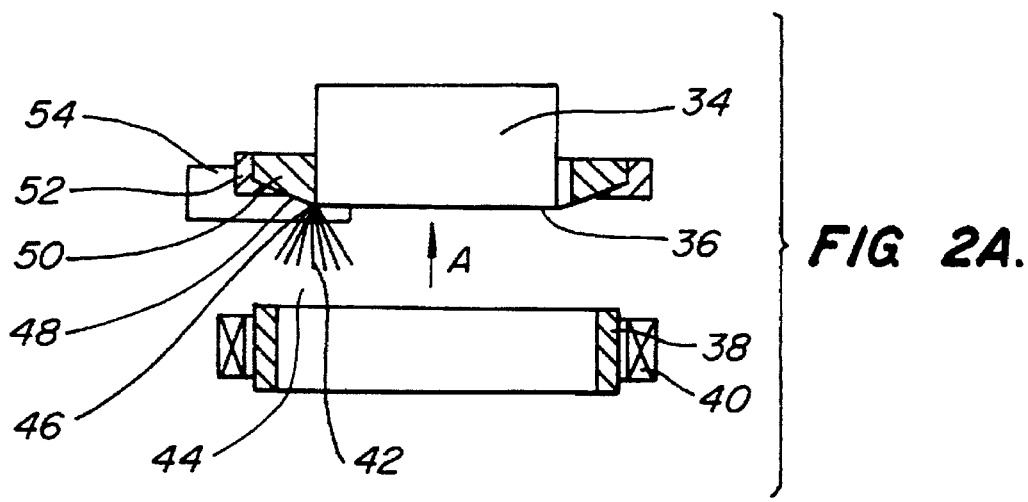
FIGS. 2 and 3 illustrate in cross-section pulse-type electromagnetic erosive plasma accelerators in accordance with the invention.
Figure 3:
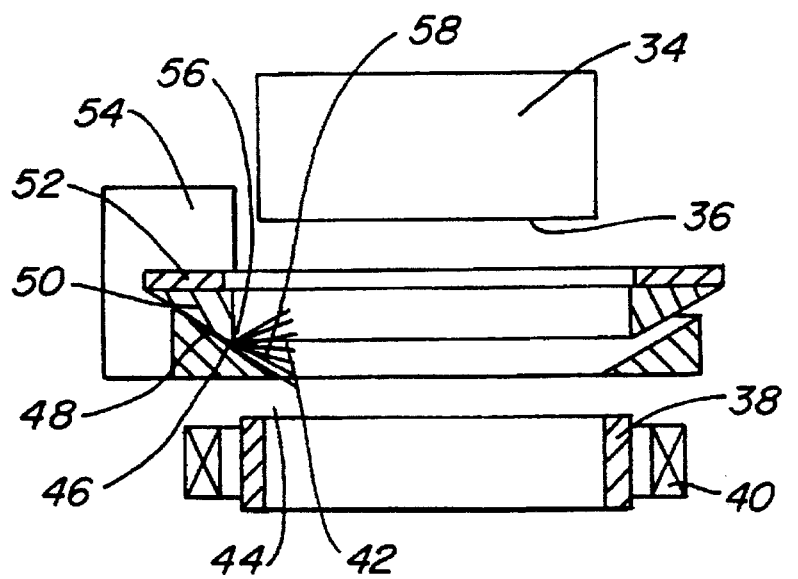

FIGS. 2a and 3 are cross-sectional views of one embodiment of an accelerator. As shown, each accelerator should contain at least two main electrodes; a consumable eroding electrode, 34, and a non-consumable electrode, 38. Consumable electrode 34 has a plasma-forming surface 36 and functions as a cathode of the accelerator. Non-consumable electrode 38 may function as an anode of the accelerator.

Non-consumable electrode 38 is encompassed by an electromagnetic coil 40. A portion 42 of the initiating plasma in the plasma accelerator of the embodiment of FIG. 2a comprises an electroerosive plasma of a substance of plasma-forming surface 36 of main eroding electrode 34. This plasma is injected into an electrode gap 44 of the accelerator in response to passing a firing-current pulse through it. To pass the firing-current pulse a localized contact 46 with a thin-film conductor 48 applied onto the surface of an insulator 50 and which is in contact with a firing electrode 52 is used.

In the preferred embodiment the accelerator is provided with a means 54 for the creation of an external heterogeneous magnetic field, the induction of which is substantially parallel to the plasma-forming surface 36 of consumable electrode 34. The external heterogeneous magnetic field created by means 54 has its maximum in the area of localized contact 46. Localized contact 46 is arranged in such a manner that in the course of the excitation of the vacuum electrical arc dischargers in the accelerators it can change its position on the eroding electrode, for example by rolling an isolator 50. Means 54 is in turn made so that it can be moved synchronously with the variation of the position of localized contact 46. The corresponding mechanisms are not shown. In this embodiment the variation of the accelerator and the displacement of the magnetic field are carried out in the direction of arrow C as illustrated in FIG. 2b.

Figure 2B:
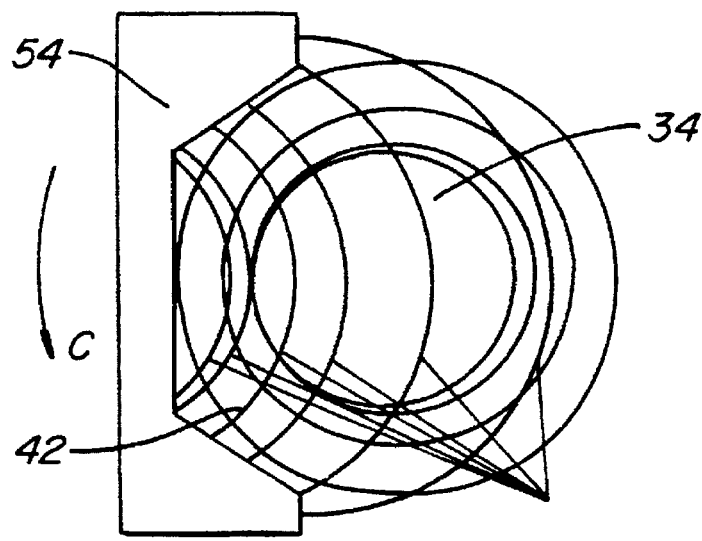

The accelerator illustrated in FIGS. 2a and 2b with localized contact 36 on the main eroding electrode 34 is preferable for generating pulse flows of the accelerated electroerosive plasma of metals and their alloys. For generating pulse flows of an accelerated electroerosive plasma of carbon (graphite) or an electroerosive plasma containing carbon and metal, it is preferable to use the plasma accelerator of the type shown in FIG. 3. In such an accelerator the main consumable electrode 34 is made of graphite. Such an accelerator additionally contains a consumable electrode 56 with a plasma-forming surface 58. A portion 52 of the plasma-forming substance in this embodiment comprises an electroerosive plasma of a substance of the abovementioned plasma-forming surface 58 of auxiliary eroding electrode 56. This initiating plasma is obtained in a localized contact 46 of electrode 56 with a thin-film conductor 48. In this accelerator, the substance of auxiliary eroding electrode 56 comprises graphite, or a metal or alloy. It is preferable that the induction of the magnetic field be substantially parallel both with the plasma-forming surface 58 of the auxiliary consumable electrode 56 and with the plasma-forming surface 36 of the main consumable electrode 34.

The method of the invention is preferably carried out as follows. A carrier 16 is placed into vacuum chamber 10 and the chamber is evacuated to a pressure of from about $10^{-5}$ to $10^{-6}$ Torr. The surface of the carrier is then cleaned with the ions of an inert gas, such as argon, with the energy of its particles within the range of from 300 eV to 3 KeV. The carrier surface is also subjected to degassing of the substance of eroding electrodes 34a and 34b, by means of vacuum electrode discharges.

A pulse of a firing-current with a voltage amplitude equal to 700+/−50 V is periodically passed through localized contact 46, of consumable electrode 34 with thin-film conductor 48, which is applied onto the surface of insulator 50, and is in contact with a firing electrode 52. The explosive evaporation of the substance of the eroding electrode results in the formation of a portion of initiating plasma 42 which is injected into electrode gap 44 of the plasma accelerator. Simultaneously short-term vacuum electrical arc discharges with a probability of not less than 0.95 and a voltage amplitude on the electrodes from about 200 V to 400 V with a duration of the discharge from about 0.5 ms to 1 ms and a current amplitude from about 5 kA to 10 kA are excited in gap 44.

The position of the localized contacts on the eroding electrode are changed from pulse to pulse, for example by rolling isolator 50. Plasma-forming surfaces of the consumable electrode experience the effect of the heterogeneous magnetic field which is generated by means 54 and which is moved, preferably synchronously with the variation in the localized contact. Pulse flows 32a and 32b of the electroerosive plasma of a substance to be deposited are generated and directed towards the surface of carrier 16, and a vacuum condensate is formed as a result of the precipitation of the above flows. The frequency of occurrence of the generated plasma flows is normally within the range of about 8 to 16 Hz. The preferred ratio of the density of each anticipated flow of plasma to the density of the flow of particles is within the range $8 \times 10^2$ to $5 \times 10^3$. This ratio is maintained by strictly controlling the pressure of residual gases in the precipitation chamber as well as the conditions for the generation of vacuum electric charge dischargers.

When the abrasive material is produced on a carrier, the vacuum condensate is imparted a given surface texture, for example by forming island-like films of metal and alloys. When it is necessary to produce an abrasive material without a carrier, the vacuum condensate thus formed is separated from the carrier.

The invention will be further clarified with reference to practical examples and results of tests of the obtained abrasive materials. In all of the following examples, the impurity levels of the consumable electrodes did not exceed 0.1 atomic percent.

EXAMPLES

Example No. 1

The deposition chamber was evacuated to a residual pressure of $P=5 \times 10^{-6}$ Torr. The pulse-flows of electroerosive plasma of carbon were generated by means of a plasma accelerator containing both a main consumable electrode and an auxiliary consumable electrode. The substance used in both consumable electrodes was graphite. A portion of the initiating plasma was obtained with the use of the auxiliary electrode. The firing current pulses had a voltage amplitude, $V_f$, of 700 V. The voltage amplitude, $V_a$, on the accelerator electrodes was 250 V. The duration, t, of each electrical arc impulse was 1 ms. The amplitude of the discharge current, $I_a$, was 5 kA. The probability, p, of excitation of the discharge was greater than or equal to 0.99. Induction of the external magnetic field, $P_{max}$, in the area of localized contact was 2 mTl. The frequency of occurrence of the generated plasma flows, f, was 8 Hz. The ratio of $N_p/N_g$ was $8 \times 10^2$. The formation of a vacuum condensate was discontinued when the thickness, d, of the deposited layer reached 0.4 micrometers. The obtained abrasive material comprised a vacuum condensate consisting of 99.9 atomic percent ultradispersed composite superhard carbon-type diamond substance, about 0.05 atomic percent hydrogen, and about 0.05 atomic percent of oxygen. The microhardness, H, of this vacuum condensate was 9800 kg/mm$^2$. The electrical surface resistivity, R, was $4 \times 10^8$ Ohms.

Example No. 2

In this example abrasive material was formed under the same conditions as in Example 1, with the following exceptions: $P=5 \times 10^{-5}$ Torr; $V_a=100$ V; $t=0.5$ microseconds; $p > or = 0.95$; $f=16$ Hz; and $N_p/N_g=10^2$. The composition of the vacuum condensate was 99.8 atomic percent ultradispersed composite carbon-type diamond-like substance, about 0.1 atomic percent hydrogen, and about 0.1 atomic percent oxygen. The vacuum condensate had a microhardness, H, of 8000 kg/mm$^2$ and a specific electrical surface resistivity, R, of $10^8$ Ohms.

Example No. 3

In this example abrasive material was formed under the same conditions as in Example 1, with the following exceptions: $P=5 \times 10^{-7}$ Torr; $V_a=500$ V; $t=0.25$ microseconds; $I_a=10$ kA; $f=1$ Hz; and $N_p/N_g=5 \times 10^3$. The composition of the vacuum condensate was 99.96 atomic percent ultradispersed composite carbon-type diamond-like substance, about 0.02 atomic percent hydrogen, and about 0.02 atomic percent oxygen. The vacuum condensate had a microhardness, H, of 11,700 kg/mm$^2$ and a specific electrical surface resistivity, R, of $10^6$ Ohms.

Example No. 4

In this example abrasive material was formed under the same conditions as in Example 1 except that the auxiliary electrode was metal, specifically holium. Therefore the plasma accelerator could generate pulses of the accelerated electroerosive plasma containing both carbon and holium. The formation of the vacuum condensate was discontinued when the thickness, d, of the precipitated layer reached 0.8 micrometers. The composition of the vacuum condensate was 99.9 atomic percent untradispersed composite superhard carbon-type diamond substance of which 4 atomic percent was holmium, plus about 0.05 atomic percent hydrogen and about 0.05 atomic percent oxygen. The microhardness, H, of the vacuum condensate was 7800 kg/mm. The surface electrical resistivity, R, was $8 \times 10^5$ Ohms.

Example No. 5

In this example an abrasive material was formed under the same conditions as in Example 4 except that the auxiliary electrode was chromium. There was 5 atomic percent of chromium in the vacuum condensate. The composition of the vacuum condensate was 99.9 atomic percent untradispersed composite superhard carbon-type diamond substance of which 5 atomic percent was chromium, plus about 0.05 atomic percent hydrogen and about 0.02 atomic percent oxygen. The microhardness, H, of the vacuum condensate was 7300 kg/mm. The surface electrical resistivity, R, was $5 \times 10^5$ Ohms.

Example No. 6

In this example an abrasive material was formed under the same conditions as in Example 1, with the exception that the auxiliary plasma accelerator was used to independently generate pulses of the flow of the accelerated electroerosive plasma. The auxiliary consumable electrode was of metal, specifically ytterbium. The duration, t, of electrical arc charges in the accelerator was 0.5 ms and the discharge current amplitude, Ia, was 1 kA. The formation of the vacuum condensate was discontinued when the thickness, d, of the deposited layer reached 1.2 micrometers. The composition of the vacuum condensate was 99.9 atomic percent untradispersed composite superhard carbon-type diamond substance of which 10 atomic percent was ytterbium, plus about 0.05 atomic percent hydrogen and about 0.05 atomic percent oxygen. The microhardness, H, of the vacuum condensate was 6900 kg/mm. The surface electrical resistivity, R, was $7 \times 10^3$ Ohms.

Example No. 7

In this example an abrasive material was formed under the same conditions as in Example 4, with the exception that the auxiliary consumable electrode was made of yttrium. Furthermore, in order to obtain a vacuum condensate similar to that of Example 6, an auxiliary plasma accelerator was used, independently generating pulse flows of the accelerated electroerosive plasma of another metal, molybdenum, at an amplitude of current discharge, Ia, of 2.5 kA. During the process, the generation was carried out in two alternating modes, which differed by the duration, t, and the number, N, of vacuum electrical arc discharges. In the first mode t was equal to 0.2 ms and N was equal to 500 while in the second mode t was equal to 1 µs and N was equal to 100. The formation of the vacuum condensate was discontinued when the thickness, d, of the deposited layer reached 1.2 micrometers. The obtained abrasive material comprised a vacuum condensate containing about 20 atomic percent of metal (yttrium and molybdenum), about 79.9 atomic percent of an ultradispersed composite superhard diamond-like substance (which contained approximately 5 atomic percent yttrium and approximately 5 atomic percent molybdenum), about 0.05 atomic percent hydrogen, and about 0.05 atomic percent oxygen. The microhardness, H, of the vacuum condensate was 5400 kg/mm$^2$ and the surface electrical resistivity, R, was $10^2$ Ohms.

Example No. 8

In this example an abrasive material was formed under conditions similar to Example 6, with the exception that the auxiliary consumable electrode was made of nickel. The cycles of generation of pulse flows of electroerosive plasma alternated between the electrical arc discharges in the main accelerator (which had its consumable electrodes made of graphite) and those in the auxiliary accelerator (which had the consumable electrode made of nickel). The modes of generation were identical except that the number of vacuum electrical arc discharges in the main accelerator, $N_{main}$ was 500 and the number of vacuum electrical arc discharges in the auxiliary accelerator, $N_{aux}$, was 200. The obtained abrasive material comprised a vacuum condensate containing about 10 atomic percent of nickel, about 89.9 atomic percent of an ultradispersed composite superhard diamond-like substance, about 0.05 atomic percent hydrogen, and about 0.05 atomic percent oxygen. The microhardness, H, of the vacuum condensate was 6400 kg/mm$^2$ and the surface electrical resistivity, R, was 60 Ohms.

Example No. 9

In this example an abrasive material was formed under the same conditions as those of Example 8, with the exception that nickel was deposited only as a sublayer in the form of an island-like film. The obtained abrasive material had a distinctly expressed surface texture. The composition of the vacuum condensate was 99.9 atomic percent ultradispersed composite carbon-type diamond-like substance, about 0.05 atomic percent hydrogen, and about 0.05 atomic percent oxygen. The vacuum condensate had a microhardness, H, of 10,000 kg/mm$^2$ and a specific electrical surface resistivity, R, of $2 \times 10^6$ Ohms.

Example No. 10

In this example an abrasive material was formed under the same conditions as those of Example 1, with the exception that the vacuum condensate was formed with a thickness, d, of 3 micrometers. Its microhardness, H, was 9200 kg/mm$^2$ and the surface electrical resistivity, R, was $6 \times 10^5$ Ohms. The vacuum condensate was easily separated from the carrier by vibration, forming plate-like particles of uniform thickness, with dimensions equal to 3 micrometers in the transverse direction and 15 micrometers in the longitudinal direction.

The table below summarizes the abrasive characteristics of samples taken from Examples 1–9.

| | OBJECT BEING TREATED: VIDEORECORDER HEAD | | | |
|---|---|---|---|---|
| Ex. Number | Micro-hardness, H,kg/mm$^2$ | Surface electrical resistivity, R, Ohms | Polishing capacity (depth of cutting), in micrometers | Number of scratches |
| 1 | 9800 | $4 \times 10^6$ | 19 | — |
| 2 | 8000 | $10^8$ | 21 | — |
| 3 | 11700 | $10^6$ | 23 | — |
| 4 | 7800 | $8 \times 10^5$ | 20 | — |
| 5 | 7300 | $5 \times 10^5$ | 18 | — |
| 6 | 6900 | $7 \times 10^3$ | 17 | — |
| 7 | 5400 | $10^2$ | 14 | — |
| 8 | 6400 | 60 | 10 | — |
| 9 | 10000 | $2 \times 10^6$ | 28 | 1 |

The structures of the thin-film diamond-like substances and the vacuum condensates from Examples 1–10 were studied on samples peeled from the carriers. X-ray diffraction techniques were used to study each sample using a Dron-2-type instrument and a JEM-120-type electron transmission microscope. The type of chemical bonds and elementary analysis were studied by means of a ES-2403 instrument operating on the principle of Auger spectroscopy and electron spectroscopy.

Precision electron-diffraction measurement methods were used for determining a function Diff(r) of radial distribution in accordance with a well-known procedures. (See for example "Diffraction Studies on Non-Crystalline Substances," I. Hargittai and W. J. Orvill-Thomas, Academiat Klado, Budapest, 1981).

When the substance studied is in a quasi-amorphous state, the Diff(r) function demonstrates sharp oscillations, the maximums, considered in combination with the mass density of the substance, make it possible to determine interatomic distances as well as the values of coordinate numbers and coordinate polyhedrons in the structure. Processing the data obtained in these examples verified that the obtained vacuum condensates contained an ultradispersed composite diamond-like substance with theoretical values of ordered regions (i.e., regions of coherent dissipation) within the range of 0.5 to 20 nm. This substance is characterized by predetermined ratios of sp$^3$, sp$^2$ and sp bonds and by the prevalence of the sp and sp$^3$ bonds in the quasi-amorphous spatial structure of the vacuum condensate.

Surface electrical resistivity was measured by means of an Ohm-meter (model Tokyo Denski STACK TR-3). Microhardness was measured with an instrument for measuring microhardnesses (model MINILOAD). The depth of cutting was measured by an electronic digital indicator. Surface roughness was measured by a Wyko-type interferometer.

While the invention has been particularly shown and described with reference to specific embodiments thereof, it will be understood by those skilled in the art that the foregoing and other changes in the form and details may be made therein without departing from the spirit or scope of the invention.

We claim:

1. An abrasive material, comprising:
   a flexible polymeric substrate, said substrate having a surface texture defined by a plurality of surface irregularities; and
   a diamond-like carbon-based material coating deposited on said textured substrate to form said abrasive surface, said diamond-like carbon-based material having a Vickers hardness of at least 5500 kilograms per square millimeter, wherein said diamond-like carbon-based material comprises at least 80 atomic percent carbon, less than 0.1 atomic percent hydrogen, and less than 0.1 atomic percent oxygen.

2. The abrasive material of claim 1 wherein said surface irregularities range in height from about 0.02 to about 2.0 micrometers.

3. The abrasive material of claim 1 wherein said plurality of surface irregularities are nonuniformly distributed on said substrate.

4. The abrasive material of claim 1 wherein said diamond-like carbon-based material further comprises at least one metal.

5. The abrasive material of claim 4 wherein said metal is selected from the group consisting of holmium, erbium, ytterbium, yttrium, dysprosium, gadolinium, chromium, molybdenum, tungsten, hafnium, titanium, zirconium, and nickel.

6. The abrasive material of claim 1, further comprising a layer interposed between said textured substrate and said diamond-like carbon material, said layer selected from the group consisting of adhesive layers and stress reducing layers.

7. The abrasive material of claim 1, wherein said polymeric substrate is selected from the group consisting of polyolefin, polyamide, polycarbonate, polyacrylate, polyimide, polyester, copolymers thereof, and mixtures thereof.

8. The abrasive material of claim 1, further comprising at least one layer of a metal, said metal layer applied using a vacuum process.

9. An abrasive powder comprising a plurality of diamond-like carbon-based platelet particles, said particles having a substantially uniform thickness in the range of about 0.02 micrometers to about 4.0 micrometers, wherein said particles have a Vickers hardness of at least 5500 kilograms per square millimeter, and wherein said particles are comprised of at least 80 atomic percent carbon, less than 0.1 atomic percent hydrogen, and less than 0.1 atomic percent oxygen.

10. The abrasive powder of claim 9, wherein said platelet particles have a transverse dimension and a longitudinal dimension, said transverse dimension in a range of about 2 to 1000 times the thickness, and said longitudinal dimension in a range of about 2 to 100,000 times the thickness.

11. The abrasive powder of claim 9, wherein said plurality of diamond-like carbon-based platelet particles are dispersed within a binder and adhered to a substrate.

12. An abrasive material comprising:

a smooth flexible polymeric substrate; and a diamond-like carbon-based material coating deposited on said substrate to form said abrasive surface, said diamond-like carbon-based material coating having a surface texture when deposited on said substrate, said surface texture defined by a plurality of surface irregularities, and said diamond-like carbon-based material coating having a Vickers hardness of at least 5500 kilograms per square millimeter, wherein said diamond-like carbon-based material coating comprises at least 80 atomic percent carbon, less than 0.1 atomic percent hydrogen, and less than 0.1 atomic percent oxygen.

13. The abrasive material of claim 12, wherein said surface irregularities range in height from about 0.02 to about 2.0 micrometers.

14. The abrasive material of claim 12, further comprising at least one layer of a metal, said metal layer applied using a vacuum process.

15. An abrasive material, comprising:

a flexible substrate, said substrate selected from the group consisting of polymers, cloths, and papers; and a diamond-like carbon-based material coating adhered to said flexible substrate, wherein said diamond-like carbon-based material coating is comprised of a plurality of diamond-like carbon-based platelet particles dispersed within a binder, said particles having a Vickers hardness of at least 5500 kilograms per square millimeter, and wherein said particles are comprised of at least 80 atomic percent carbon, less than 0.1 atomic percent hydrogen, and less than 0.1 atomic percent oxygen.

* * * * *